United States Patent
Zhou et al.

(10) Patent No.: US 9,360,674 B2
(45) Date of Patent: Jun. 7, 2016

(54) DUAL-VIEW DISPLAY SUBSTRATE AND DISPLAY DEVICE

(71) Applicants: BOE TECHNOLOGY GROUP CO., LTD., Beijing (CN); BEIJING BOE CHATANI ELECTRONICS CO., LTD., Beijing (CN)

(72) Inventors: Zhendong Zhou, Beijing (CN); Yang Zhao, Beijing (CN)

(73) Assignees: BOE TECHNOLOGY GROUP CO., LTD., Beijing (CN); BEIJING BOE CHATANI ELECTRONICS CO., LTD., Beijing (CN)

( * ) Notice: Subject to any disclaimer, the term of this patent is extended or adjusted under 35 U.S.C. 154(b) by 26 days.

(21) Appl. No.: 14/360,853

(22) PCT Filed: Apr. 26, 2013

(86) PCT No.: PCT/CN2013/074810
§ 371 (c)(1),
(2) Date: May 27, 2014

(87) PCT Pub. No.: WO2014/127586
PCT Pub. Date: Aug. 28, 2014

(65) Prior Publication Data
US 2015/0338666 A1   Nov. 26, 2015

(30) Foreign Application Priority Data

Feb. 19, 2013 (CN) .......................... 2013 1 0053609
Apr. 3, 2013 (CN) .......................... 2013 1 0116096

(51) Int. Cl.
*G02B 27/10* (2006.01)
*H04N 13/04* (2006.01)
(Continued)

(52) U.S. Cl.
CPC ............ *G02B 27/1066* (2013.01); *G02B 27/06* (2013.01); *G02B 27/2214* (2013.01);
(Continued)

(58) Field of Classification Search
CPC .... G02B 27/2214; G02B 27/26; G02B 27/22; G02B 27/2228; G02B 2027/0134; G02B 27/14
USPC ............... 345/33; 348/42; 359/454, 458, 459, 359/464, 465, 618
See application file for complete search history.

(56) References Cited

U.S. PATENT DOCUMENTS

2005/0012842 A1 * 1/2005 Miyagawa ......... H04N 1/00129
348/333.01
2008/0285282 A1    11/2008 Karman et al.

FOREIGN PATENT DOCUMENTS

CN        101297414 A     10/2008
CN        202145468 U      2/2012
(Continued)

OTHER PUBLICATIONS

Korean Examination Opinion dated May 11, 2015; Appln. No. 10-2014-7014344.
(Continued)

*Primary Examiner* — Mahidere Sahle
(74) *Attorney, Agent, or Firm* — Ladas & Parry LLP

(57) ABSTRACT

A dual-view display substrate and a dual-view display device are provided. The dual-view display substrate includes a base substrate; first display areas and second display areas are alternately arranged and disposed on the base substrate; the first display areas and the second display areas are respectively provided with display units; main light-emitting directions of the display units of each first display area are consistent with each other and correspond to a first view region from which only the first display areas can be viewed; and main light-emitting directions of the display units of each second display area are consistent with each other and correspond to a second view region from which only the second display areas can be viewed.

16 Claims, 2 Drawing Sheets

(51) Int. Cl.
  *H01L 51/00* (2006.01)
  *H01L 51/52* (2006.01)
  *G02B 27/06* (2006.01)
  *G02B 27/22* (2006.01)
  *H01L 27/32* (2006.01)

(52) U.S. Cl.
  CPC ........ *H01L51/0095* (2013.01); *H01L 51/5275* (2013.01); *H04N 13/0445* (2013.01); *H01L 27/3267* (2013.01); *H04N 13/0409* (2013.01); *H04N 2013/0461* (2013.01); *H04N 2013/0463* (2013.01)

(56) References Cited

FOREIGN PATENT DOCUMENTS

| | | |
|---|---|---|
| JP | 2009-514157 A | 4/2009 |
| KR | 20090055913 A | 6/2009 |

OTHER PUBLICATIONS

Second Chinese Office Action dated Jun. 30, 2015; Appln. No. 201310116096.3.
First Chinese Office Action dated Feb. 15, 2015; Appln. No. 201310116096.3.
International Search Report Appln. No. PCT/CN2013/074810; Dated Nov. 21, 2013.
International Preliminary Report on Patentability dated Aug. 25, 2015; PCT/CN2013/074810.
Third Chinese Office Action dated Nov. 3, 2015; Appln. No. 201310116096.3.
Korean Office Action dated Nov. 24, 2015; Appln. No. 10-2014-7014344.

* cited by examiner

DUAL-VIEW DISPLAY SUBSTRATE AND DISPLAY DEVICE

TECHNICAL FIELD

Embodiments of the present invention relate to a dual-view display substrate and a dual-view display device.

BACKGROUND

Dual-view display refers to the display technology through which different images can be viewed from two sides (e.g., left side and right side) in front of a display screen.

A traditional dual-view display is mainly realized by means of a grating. As illustrated in FIG. 1, a parallax barrier grating 9 is disposed in front of a display screen 10; the display screen 10 includes first display areas 511 and second display areas 512 which are alternately arranged; and the parallax barrier grating 9 includes light shield bars and light transmission bars which are alternately arranged. Due to the function of the parallax barrier grating 9, an image displayed by one part of the display area (including a plurality of first display areas 511) of the display screen can only be viewed from a left view region 81 on the left of the screen, and an image displayed by the other part of the display area (including a plurality of second display areas 512) can only be viewed from a right view region 82 on the right of the screen. Moreover, a crosstalk area 83 is disposed between the left view region 81 and the right view region 82, and the images displayed by the first display areas 511 and the second display areas 512 can be viewed here at the same time; and therefore the displayed information cannot be normally received. The first display areas 511 and the second display areas 512 are alternately arranged and are each provided with a plurality of display units. In this way, the dual-view display can be achieved by the display screen 10 and the parallax barrier grating 9.

As three-dimensional (3D) display requires the simultaneous viewing of the first display areas 511 and the second display areas 512, a 3D display viewing area corresponds to the crosstalk area 83 in the dual-view display. Therefore, a 3D display may be viewed as a special dual-view display.

The above traditional dual-view display at least has the disadvantages that: the dual-view display is achieved with the parallax barrier grating, but the grating has a complex and fine structure, is difficult to manufacture and invokes high costs, and the dual-view effect can be affected in the case of slight deviation of the position between the parallax barrier grating and the display area.

SUMMARY

The embodiments of the present invention overcomes the defects of complex structure, high costs and poor view effect in the traditional dual-view display technology and provides a display substrate with a simple structure, low cost and good dual-view effect.

One aspect of the present invention provides a dual-view display substrate, which comprises a base substrate; first display areas and second display areas that are alternately arranged are disposed on the base substrate; the first display areas and the second display areas are respectively provided with display units; main light-emitting directions of the display units of each first display area are consistent with each other and correspond to a first view region from which only the first display areas can be viewed; and main light-emitting directions of the display units of each second display area are consistent with each other and correspond to a second view region from which only the second display areas can be viewed.

"Main light-emitting direction" of the display unit refers to that although the light of the display unit has a certain divergence angle; most light is emitted with focusing on one direction and usually emitted from the vertical direction to the display unit.

In the dual-view display substrate provided by the present invention, the display units respectively disposed at the first display areas and the second display areas have different main light-emitting directions, so that images displayed by the first display areas as a whole and the second display areas as a whole on the display substrate can be respectively viewed by a user from different sides of the display substrate, and hence the dual-view display effect can be achieved in the case of no parallax barrier grating. Therefore, the structure is simple; the cost is low; and the dual-view effect is good.

For instance, the base substrate is provided with a plurality of ribs; the ribs include first display unit supporting portions and second display unit supporting portions; the first display unit supporting portions are configured to dispose the display units of the first display areas; and the second display unit supporting portions are configured to dispose the display units of the second display areas.

For instance, the plurality of ribs are arranged in parallel.

For instance, a first angle is formed between a surface of one first display unit supporting portion along a counterclockwise direction and the normal direction of the display substrate; a second angle is formed between a surface of one second display unit supporting portion along a clockwise direction and the normal direction of the display substrate; and the first angle and the second angle are not 90 degrees at a same time.

"Normal direction of the display substrate" refers to the direction perpendicular to a surface of the base substrate of the display substrate. The normal directions of areas in which the first display areas are disposed are consistent with each other and the normal directions of areas in which the second display areas are disposed are consistent with each other.

For instance, a cross-section of each rib is an isosceles triangle. Two sides of the isosceles triangle correspond to the first display unit supporting portion and the second display unit supporting portion of the rib respectively, namely the first angle is equal to the second angle.

Moreover, for instance, when a cross-section of each rib is an isosceles triangle, both the first angle and the second angle are 45 degrees.

For instance, the cross-section of the rib is a right trapezoid. An upper base and an oblique leg of the right trapezoid correspond to the first display unit supporting portion and the second display unit supporting portion of the rib respectively, namely one of the first angle and the second angle is 90 degrees.

For instance, the base substrate further includes a molded layer; and the ribs are formed in the molded layer.

The embodiment of the present invention overcomes the defects of complex structure, high costs and poor view effect in the traditional dual-view display technology and provides a dual-view display device with a simple structure, low cost and good dual-view effect.

In another aspect, the present invention provides a dual-view display device, which comprises the foregoing dual-view display substrate.

As the dual-view display device provided by the present invention comprises the foregoing dual-view display substrate, the dual-view display device has a simple structure, low cost and good dual-view effect.

For instance, the dual-view display device further comprises a sealing layer formed on the dual-view display substrate. For instance, the sealing layer has a planar surface.

BRIEF DESCRIPTION OF THE DRAWINGS

Simple description will be given below to the accompanying drawings of the embodiments to provide a more clear understanding of the technical proposals of the embodiments of the present invention. It will be obvious to those skilled in the art that the drawings described below only involve some embodiments of the present invention but are not intended to limit the present invention.

REFERENCE NUMERALS

4: Sealing Layer; 5: Substrate; 511: First Display Area; 512: Second Display Area; 52: Molded layer; 53: Base Layer; 6: Display Unit; 7: Rib; 71: First Display Unit Supporting Portion; 72: Second Display Unit Supporting Portion; 81: Left View region; 82: Right View region; 83: Crosstalk Area; 9: Parallax Barrier Grating; 100: Display Substrate. α: First Angle; β: Second Angle.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. It will be obvious to those skilled in the art that the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

Unless otherwise defined, the technical terms or scientific terms used herein have common meanings understood by those skilled in the art. The words "first", "second" and the like do not indicate the sequence, the number or the importance but are only used for distinguishing different components. Similarly, the words "a", "an", "the" and the like also do not indicate the number but only indicate at least one. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

First Embodiment

Figure 2:
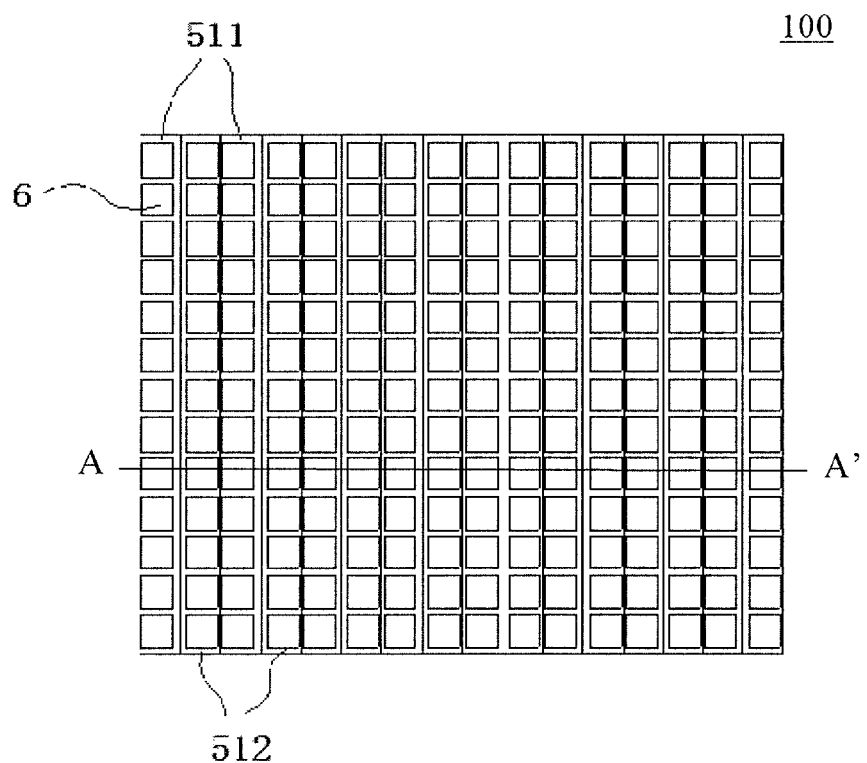
FIG. 2 is a top view of a dual-view display substrate provided by a first embodiment of the present invention.
Figure 3:
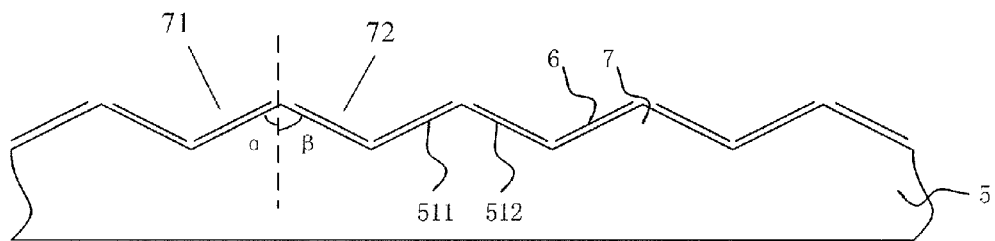
FIG. 3 is a partial sectional view of the dual-view display substrate provided by the first embodiment of the present invention.

FIG. 2 is a top view of a dual-view display substrate provided by the first embodiment. As illustrated in FIG. 2, the present embodiment provides a dual-view display substrate 100, which comprises a base substrate 5 (as illustrated in FIG. 3); a plurality of first display areas 511 and a plurality of second display areas 512, which both are elongated and alternately arranged along the transverse direction in the figure, are provided on the base substrate 5; and each of the first display areas 511 and each of the second display areas 512 are respectively provided with a plurality of display units 6. The display units 6 are illustrated by squares.

The main light-emitting directions of the display units 6 of each first display area 511 are consistent one another and correspond to a first view region (e.g., the left side in FIG. 3), from which only the first display area 511 can be viewed; and the main light-emitting directions of the display units of each second display area 512 are consistent one another and correspond to a second view region (e.g., the right side in FIG. 3), from which only the second display area 512 can be viewed.

A first angle α is formed between the surface of the base substrate in an area in which the first display area 511 is disposed along the counterclockwise direction and the normal direction of the display substrate (a dotted line in FIG. 3); and a second angle β is formed between a surface of the base substrate in an area in which the second display area 512 is disposed along the clockwise direction and the normal direction of the display substrate. Both the first angle α and the second angle β are greater than 0 degree but are not 90 degrees at the same time, namely the first display area 511 and the second display area 512 face towards different directions.

In general, both the first display areas 511 and the second display areas 512 are elongated (e.g., extending from one side of an array substrate to the other side along the longitudinal direction or the transverse direction) and alternately arranged. The first display areas 511 and the second display areas 512 may each correspond to a plurality of columns (rows) of display units 6. Moreover, each display unit 6 may work independently for display and may correspond to a pixel (or a sub-pixel: a pixel is formed of a plurality of sub-pixels (e.g., RGB sub-pixels)) of the display substrate.

The specific structure of the display unit 6 may be realized in known ways. For instance, where the display substrate provided by the embodiment is an organic light-emitting diode (OLED) display substrate, each display unit 6 may include an OLED and a corresponding drive circuit. For instance, the drive circuit may be composed of a switch transistor, a drive transistor and a storage capacitor. Moreover, for instance, when the display substrate provided by the embodiment is an electronic paper display (EPD) substrate, each display unit 6 may include a pixel electrode, a common electrode, an electronic ink layer, a corresponding drive circuit, and so on.

Meanwhile, circuit structures such as gate lines and data lines are also provided on the base substrate 5. For instance, the gate lines are transversely arranged and the data lines are longitudinally arranged. No further description will be given here for simplicity.

In the dual-view display substrate provided by the embodiment, the first display areas 511 and the second display areas 512 face towards different directions (namely the normal directions of surfaces on which the first display areas 511 and the second display areas 512 are provided are different), and light emitted by the display units 6 respectively disposed in the first display areas 511 and the second display areas 512 is directly emitted to different directions, namely the display units 6 respectively disposed in the first display areas 511 and the second display areas 512 have different main light-emitting directions. Therefore, images displayed by the first display areas and the second display areas can be respectively viewed from sides of the dual-view display substrate, and hence a parallax barrier grating is not required any more. Consequently, the dual-view display effect can be achieved by means of only surface treatment onto the base substrate of the display substrate; the structure is simple and the cost is low; meanwhile, the viewing problem caused by inaccurate alignment of the parallax barrier grating and the display substrate can be solved; and the dual-view effect is good.

FIG. 3 is a partial sectional view of the dual-view display substrate provided by the first embodiment, for instance, a sectional view along the A-A' line. As illustrated in FIG. 3, the base substrate 5 includes a plurality of ribs 7 arranged in parallel; the ribs 7 include first display unit supporting portions 71 and second display unit supporting portions 72 which correspond to the first display areas 511 and the second display areas 512 respectively. The first display unit supporting portions 71 are configured to support the display units 6 of the first display areas 511, and the second display unit supporting portion 72 is configured to support the display units 6 of the second display areas 512.

A first angle α is formed between a surface of the first display unit supporting portion 71 along the counterclockwise direction and the normal direction of the display substrate (the dotted line in FIG. 3); and a second angle β is formed between a surface of the second display unit supporting portion 72 along the clockwise direction and the normal direction of the display substrate. Both the first angle and the second angle are greater than 0 degree but are not 90 degrees at the same time, namely the first display area and the second display area face towards different directions. Obviously, the surface of the base substrate 5 can be simply divided into two groups of areas that face towards different directions by means of the ribs 7, and hence the division of the first display areas 511 and the second display areas 512 can be achieved.

"Normal direction of the display substrate" refers to the direction perpendicular to the surface of the base substrate of the display substrate as a whole and is not the normal direction of partial area in which the first display areas are disposed or the normal direction of partial area in which the second display areas are disposed.

For instance, the cross-section of each rib is an isosceles triangle. Two sides of the isosceles triangle correspond to a first display unit supporting portion 71 and a second display unit supporting portion 72 of the rib respectively. At this point, the first angle α is equal to the second angle β.

Moreover, for instance, when the cross-section of each rib is an isosceles right triangle, both the first angle α and the second angle β are 45 degrees.

The dual-view effect is the best when the orientation of the first display areas 511 and the second display areas 512 complies with a certain relationship. If both the first angle α and the second angle β are approximately 90 degrees, namely the orientations of the substrate areas in which the first display areas 511 are disposed and the substrate areas in which the second display areas 512 are disposed are nearly parallel to each other and perpendicular to the normal direction of the substrate, the images displayed by the first display areas 511 and the second display areas 512 will be mixed within a large range, and hence a crosstalk area will be large and areas capable of realizing the dual-view effect will be too small. If both the first angle α and the second angle β are approximately 0 degree, namely the orientations of the substrate areas in which the first display areas 511 are disposed and the substrate areas in which the second display areas 512 are disposed are nearly parallel to each other and parallel to the normal direction of the substrate, on one hand, the positions of two view regions are different to a great degree, and hence the viewing can become inconvenient; and on the other hand, the light emitted by the display units in the first display areas 511 and the second display areas 512 can be easily shielded by adjacent ribs 7, and hence the display effect can be affected. When both the first angle α and the second angle β are 45 degrees, the viewing effect will become better.

Figure 1:
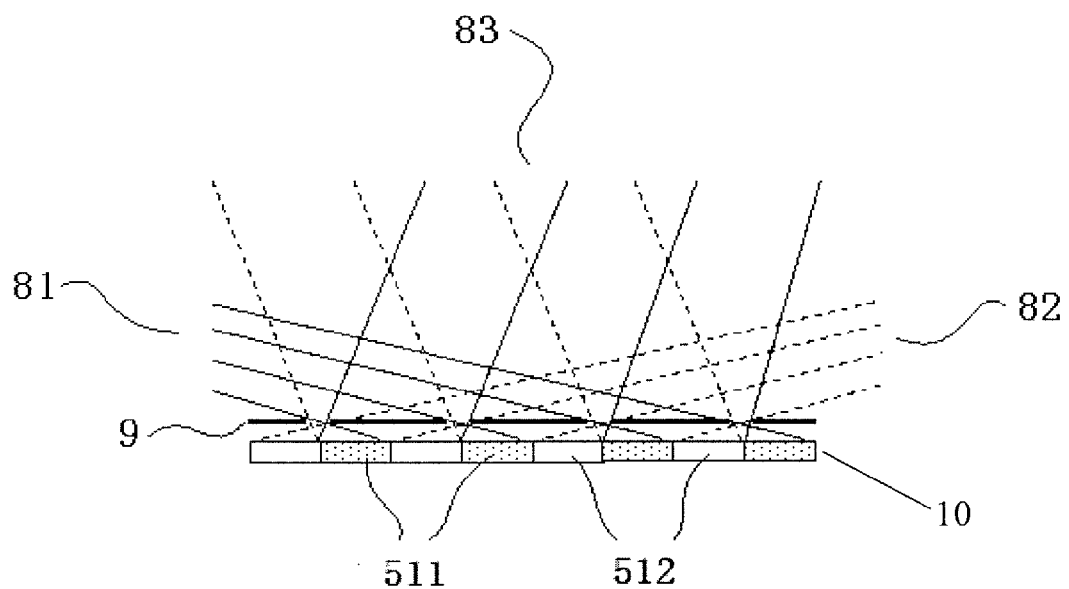
FIG. 1 is a schematic diagram illustrating a traditional technology of achieving the dual-view display through a parallax barrier grating.

In this configuration, the ribs 7 are laterally symmetrical relative to a central plane thereof. In this case, the first display areas 511 and the second display areas 512 can be respectively viewed at symmetrical positions on both sides of the base substrate 5, and hence the crosstalk area as illustrated in FIG. 1 can be reduced and even eliminated, which complies with the general dual-view habit.

Figure 4:
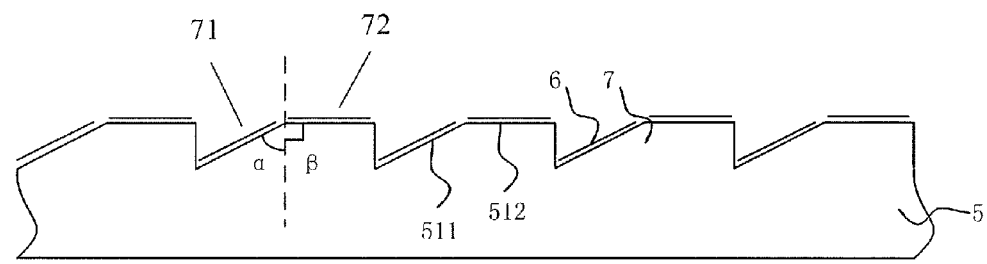
FIG. 4 is a partial sectional view of another dual-view display substrate provided by the first embodiment of the present invention.

For instance, the cross-section of each rib 7 is a right trapezoid. An upper base and an oblique leg of the right trapezoid correspond to a first display unit supporting portion 71 and a second display unit supporting portion 72 of the rib 7 respectively, namely one of the first angle and the second angle is 90 degrees. FIG. 4 is a partial sectional view of another dual-view display substrate provided by the first embodiment. As illustrated in FIG. 4, the cross-section of the rib 7 is a right trapezoid, and the upper base and the oblique leg of the right trapezoid correspond to both sides of the rib, namely the first angle α is not 90 degrees and the second angle β is 90 degrees. Of course, the case that the first angle α is 90 degrees and the second angle β is not 90 degrees is also applicable.

Of course, different orientations of the first display areas 511 and the second display areas 512 may also be achieved by arranging the base substrate 5 in other forms, as long as the first display areas 511 and the second display areas 512 face towards different directions respectively. No further description will be given here for simplicity.

In the embodiments as illustrated in FIGS. 3 and 4, the ribs 7 are one part of the base substrate 5. The base substrate 5 includes array and display circuit structures such as the display units 6. The display units 6 or light-emitting surfaces thereof are disposed on two side surfaces of each rib.

Figure 5:
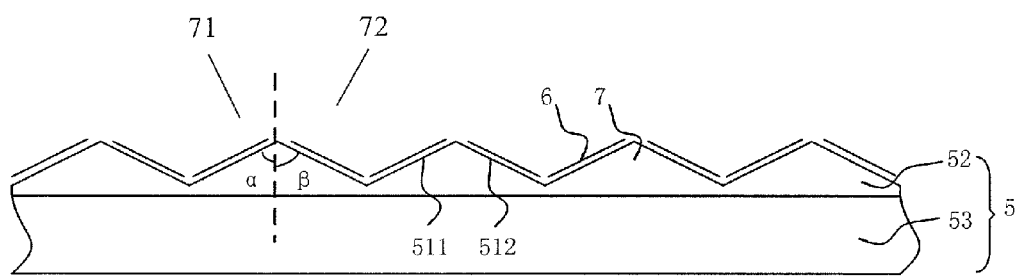
FIG. 5 is a partial sectional view of still another dual-view display substrate provided by the first embodiment of the present invention.

FIG. 5 is a partial sectional view of still another dual-view display substrate provided by the first embodiment. As illustrated in FIG. 5, the base substrate 5 includes a base layer 53 and a molded layer 52 which is processed so as to be provided with ribs 7. For instance, the base layer 53 is usually formed by a glass substrate or a plastic substrate. The base substrate 5 further includes array and display drive circuit structures such as display units 6, and the display units 6 or light-emitting surfaces thereof are disposed on a first display unit supporting portion 71 and a second display unit supporting portion 72 on two side surfaces of each rib 7. The molded layer 52 is formed on a surface of the base layer 53 and preferably made of a resin or other material for easy formation. The process of forming the ribs by a glass material is relatively complex, and the process of forming the molded layer 52 into the ribs 7 by known processes such as a embossing process and a photoetching process is relatively simple.

After the molded layer 52 and the ribs 7 thereon are formed, for instance, the display units 6 of the first display areas 511 and the display units 6 of the second display areas 512 are formed on the molded layer 52.

The display units 6 may be formed by known means in the related field. For instance, when the display substrate is an OLED display substrate, the processes such as deposition and photolithography may be adopted to form various functional layers, drive circuit structures and so on of OLEDs.

As for a substrate provided with ribs distributed in parallel, for instance, two mask plates A and B for deposition or patterning may be manufactured and correspond to the first display areas and the second display areas respectively. Firstly, a first conductive layer is deposited to form an anode or a cathode of an OLED; secondly, organic light-emitting layers are deposited sequentially, and functional layers such as a hole transport layer (HTL) and an electron transport layer (ETL) may be further formed; thirdly, a second conductive layer is deposited to correspondingly form the cathode or the anode of the OLED; and at this point, the structure of an OLED device is formed. Of course, a thin-film transistor (TFT) taken as a drive element and a switch element must also be manufactured before the OLED device is formed, namely the traditional step of manufacturing an array substrate is divided into two steps to form corresponding members in the first display area and the second display area respectively.

Where the display substrate is an EPD substrate, for instance, an EPD film may be independently prepared at first and then adhered to the surface of a molded layer 52. Moreover, the display film is conformal with the molded layer 52 and has first display areas and second display areas with different light-emitting directions.

Moreover, preferably, the ribs 7 are formed by the embossing process or the photoetching process using a double-tone mask plate. That is to say, the molded layer 52 provided with the ribs 7 may be directly formed by the embossing process and hence, for instance, adhered to the surface of the base substrate 5. Or the integral molded layer 52 may be formed at first and hence processed to form the ribs 7 with the photoetching process using a double-tone mask plate. The double-tone mask plate is also referred to as gray-tone mask plate and can be used to etch different positions of a film layer for different degrees so as to form the ribs 7.

Second Embodiment

Figure 6:
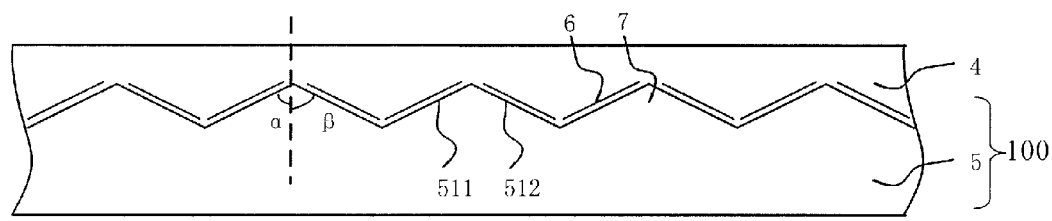
FIG. 6 is a partial sectional view of a dual-view display device provided by a second embodiment of the present invention.

As illustrated in FIG. 6, the embodiment provides a dual-view display device, which comprises the foregoing dual-view display substrate provided by the above-described embodiment.

As the dual-view display device provided by the embodiment comprises the foregoing dual-view display substrate, the dual-view display device has a simple structure, low cost and good dual-view effect.

Preferably, the dual-view display device further comprises a sealing layer formed on the dual-view display substrate.

As illustrated in FIG. 6, the sealing layer 4 is configured to seal a surface of the dual-view display substrate. As an upper surface of the sealing layer 4 is planar, the surface of the dual-view display device is planar as well so as to prevent the ribs 7, the display units 6 and other structures from being damaged. The sealing layer 4 may be formed by a known method, material and the like. For instance, the sealing layer 4 may be formed by coating a resin material on the surface of a display substrate 100 and performing a planarization process. Therefore, no further description will be given here for simplicity.

Of course, the dual-view display device provided by the embodiment, for instance, may further comprise other known structures such as a power supply, a drive IC and a frame. No further description will be given here for simplicity.

The foregoing is only the preferred embodiments of the present invention and not intended to limit the scope of protection of the present invention. The scope of protection of the present invention should be defined by the appended claims.

The invention claimed is:

1. A dual-view display substrate, comprising a base substrate, first display areas and second display areas that are alternately arranged being disposed on the base substrate, the first display areas and the second display areas respectively being provided with display units, wherein
   main light-emitting directions of the display units of each first display area are consistent with each other and correspond to a first view region from which only the first display areas can be viewed; and main light-emitting directions of the display units of each second display area are consistent with each other and correspond to a second view region from which only the second display areas can be viewed; and
   the base substrate includes a base layer and a molded layer formed on the base layer; and a plurality of ribs are formed in the molded layer.

2. The dual-view display substrate according to claim 1, wherein the ribs include first display unit supporting portions and second display unit supporting portions; the first display unit supporting portions correspond to the display units of the first display areas; and the second display unit supporting portions correspond to the display units of the second display areas.

3. The dual-view display substrate according to claim 2, wherein the plurality of ribs are arranged in parallel.

4. The dual-view display substrate according to claim 3, wherein a first angle is formed between a surface of one first display unit supporting portion along a counterclockwise direction and the normal direction of the display substrate; a second angle is formed between a surface of one second display unit supporting portion along a clockwise direction and the normal direction of the display substrate; and the first angle and the second angle are not 90 degrees at a same time.

5. The dual-view display substrate according to claim 4, wherein a cross-section of each rib is an isosceles triangle; and two sides of the isosceles triangle correspond to one first display unit supporting portion and one second display unit supporting portion of the rib respectively, namely the first angle is equal to the second angle.

6. The dual-view display substrate according to claim 5, wherein both the first angle and the second angle are 45 degrees.

7. The dual-view display substrate according to claim 4, wherein a cross-section of each rib is a right trapezoid; and an upper base and an oblique leg of the right trapezoid correspond to one first display unit supporting portion and one second display unit supporting portion of the rib respectively, namely one of the first angle and the second angle is 90 degrees.

8. A dual-view display device, comprising the dual-view display substrate according to claim 1.

9. The dual-view display device according to claim 8, further comprising a sealing layer formed on the dual-view display substrate.

10. The dual-view display device according to claim 9, wherein the sealing layer has a planar surface.

11. The dual-view display substrate according to claim 2, wherein the base substrate includes a base layer and a molded layer formed on the base layer; and the ribs are formed in the molded layer.

12. The dual-view display substrate according to claim 3, wherein the base substrate includes a base layer and a molded layer formed on the base layer; and the ribs are formed in the molded layer.

13. The dual-view display substrate according to claim 4, wherein the base substrate includes a base layer and a molded layer formed on the base layer; and the ribs are formed in the molded layer.

14. The dual-view display substrate according to claim 5, wherein the base substrate includes a base layer and a molded layer formed on the base layer; and the ribs are formed in the molded layer.

15. The dual-view display substrate according to claim 6, wherein the base substrate includes a base layer and a molded layer formed on the base layer; and the ribs are formed in the molded layer.

16. The dual-view display substrate according to claim 7, wherein the base substrate includes a base layer and a molded layer formed on the base layer; and the ribs are formed in the molded layer.

* * * * *